United States Patent [19]
Edye et al.

[11] Patent Number: 5,652,498
[45] Date of Patent: Jul. 29, 1997

[54] CHARGE AND DISCHARGE MONITORING DEVICE FOR SERIALLY CONNECTED ELECTRIC STORAGE CELLS

[75] Inventors: Thomas Edye, Boudry; Paolo Reghenzi, Tavannes; Antonio de Santo, Delémont, all of Switzerland

[73] Assignee: Micro Compact Car GmbH, Germany

[21] Appl. No.: 598,052

[22] Filed: Feb. 7, 1996

[30] Foreign Application Priority Data

Feb. 7, 1995 [DE] Germany .................. 195 03 917.3

[51] Int. Cl.⁶ .......................... H01M 10/46; H01M 10/48
[52] U.S. Cl. .......................... 320/6; 320/15; 320/17; 320/48
[58] Field of Search .......................... 320/5, 6, 15, 16, 320/17, 18, 39, 48

[56] References Cited

U.S. PATENT DOCUMENTS

| | | | |
|---|---|---|---|
| 4,238,721 | 12/1980 | DeLuca et al. | 320/18 |
| 5,153,496 | 10/1992 | LaForge | 320/17 |
| 5,387,857 | 2/1995 | Honda et al. | 320/18 |
| 5,469,042 | 11/1995 | Rühling | 320/17 |

FOREIGN PATENT DOCUMENTS

| | | |
|---|---|---|
| 0277321 | 8/1988 | European Pat. Off. . |
| 34 12 541 | 10/1985 | Germany . |
| 37 00 092 | 7/1988 | Germany . |
| 37 02 591 | 8/1988 | Germany . |
| 2159671 | 12/1985 | United Kingdom . |

*Primary Examiner*—Edward Tso
*Attorney, Agent, or Firm*—Evenson, McKeown, Edwards & Lenahan P.L.L.C.

[57] ABSTRACT

The invention provides an electronic monitoring device for a battery which is constructed from a plurality of units. A separate measuring circuit module is provided for each unit, and a serial databus connects the respective measuring circuit modules to one another. A central data processing unit arranged outside the battery is connected to the serial databus. Data acquisition and storage electronics are thus integrated in the battery, while the electronics for evaluating the data are arranged external to the battery, and remain when the battery is changed.

7 Claims, 1 Drawing Sheet

CHARGE AND DISCHARGE MONITORING DEVICE FOR SERIALLY CONNECTED ELECTRIC STORAGE CELLS

BACKGROUND AND SUMMARY OF THE INVENTION

The invention relates to an electronic monitoring device for a battery which is constructed from a plurality of physically separated blocks. Traction batteries for electric vehicles, for example, form an important application and are frequently constructed in this way.

The service life of present-day traction batteries is usually substantially shorter than the service life of the vehicle in which they are installed. In conventional electronic monitoring devices for traction batteries, the battery data acquisition and storage units are usually designed so that they remain when the battery is changed. The conventional electronic monitoring devices without a ring circuit system require a relatively high outlay on cabling in order to fulfil the diverse electronic functions.

Devices of this type are disclosed, for example, German Patent Documents DE OS 34 12 541 A1 and DE OS 37 02 591 A1. The ring circuit systems in these publications are formed by simple electronic control signal and/or measurement signal leads, with the measurement data being successively interrogated by the individual measuring circuit modules, either by means of an address-encoded control signal from the central unit or as a result of successive control signals being passed on from one measuring circuit module to the next. The measurement data are transferred to the central unit without the individual measuring circuit modules having access to it.

One object of the invention is to provide an electronic monitoring device for the aforesaid type of batteries, which can monitor the battery status easily, reliably and with a low outlay on cabling.

This and other objects and advantages are achieved by the electronic battery monitoring device according to the invention, in which each battery block has assigned to it a separate measuring circuit module which is fed by the battery and which detects the necessary measured variables, such as its voltage and temperature. The individual measuring circuit modules are connected to one another with extremely small outlay on cabling by means of a simple serial databus. Furthermore, a central data processing unit, which is arranged outside the battery, is connected to the serial databus. The data processing unit, for example, a microprocessor, evaluates the battery status data and contains the more complex electronic functions.

When the battery is changed, as is necessary from time to time in the case of a vehicle traction battery, the more complex electronic functions therefore remain in the vehicle while the simple electronic functions, which are integrated into the battery in the form of the measuring circuit modules and the serial databus, are disposed of with the battery. Therefore, all that is necessary to change the battery is to uncouple the serial databus from the central data processing unit and the battery poles from the outgoing battery current lead and recouple them correspondingly.

In a preferred embodiment, a central data memory which is physically linked to one of the battery blocks and connected to the serial databus, stores the data relevant to the battery. This memory is preferably of non-volatile configuration, and is thus not reused when the battery is changed. Preferably, it is also protected against unauthorized tampering, which is especially expedient for independent battery systems, such as batteries in rental cars.

Another embodiment permits maximum simplification of the serial databus in that all the measurement data of all the measuring circuit modules are transmitted in packets. Each measuring circuit module removes the information required by it from the respective measurement packet passing via the databus and adds the measurement data which it has acquired itself. The protocol and transmission format on the serial databus are best designed so that the individual measuring circuit modules can have an identical hardware design.

According to another feature of the invention, capacitive coupling of the measuring circuit modules to one another can be realized very cost-effectively, especially in comparison with the alternative of connecting the measuring circuit modules by means of opto-couplers.

Other objects, advantages and novel features of the present invention will become apparent from the following detailed description of the invention when considered in conjunction with the accompanying drawings.

DETAILED DESCRIPTION OF THE DRAWINGS

Figure 1:
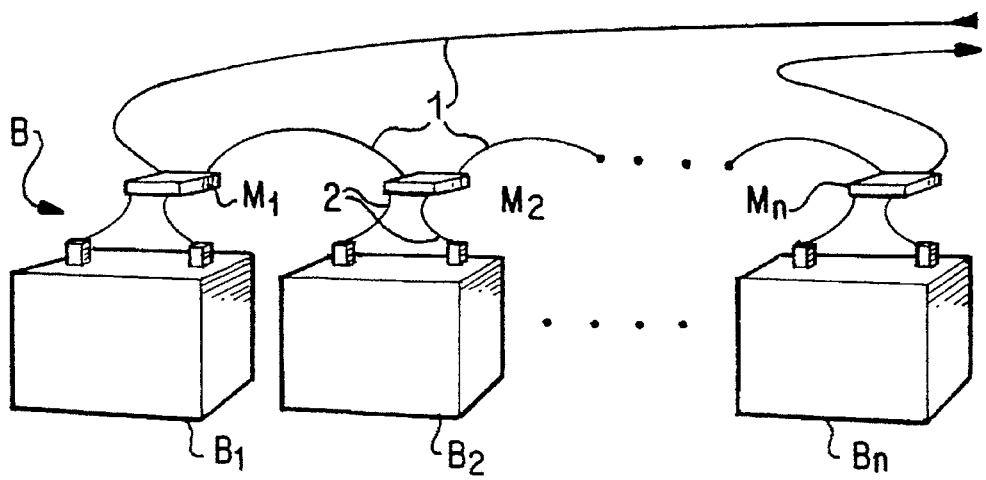
FIG. 1 is a schematic depiction of a traction battery system with integrated components of an electronic monitoring device according to the invention.

FIG. 1 is a schematic depiction of a traction battery (B) for an electric vehicle, having a number n (n>1) of individual battery blocks ($B_1, \ldots, B_n$) which are physically separated from one another. The battery blocks ($B_1$ to $B_n$) typically each produces the same voltage, between 12 V and 24 V. The battery voltage and the battery temperature of each battery block ($B_1$ to $B_n$) are monitored by small electronic measuring circuit modules ($M_1, \ldots, M_n$) which perform the required measurements for each battery block ($B_1$ to $B_n$). The measuring circuit modules ($M_1$ to $M_n$) are connected to one another by means of a simple databus (1). Coupling between the individual measuring circuit modules ($M_1$ to $M_n$) is realized capacitively, which is possible without difficulty with the voltages of between approximately 12 V to 24 V produced by the individual blocks. (Such capacitive coupling is more cost effective than the alternative of opto-couplers.) In order to record the measurement data, in each case a measuring sensor lead (2) is provided between the respective measuring circuit module ($M_1$ to $M_n$) and the associated measuring point in the battery block ($B_1$ to $B_n$).

The individual measuring circuit modules ($M_1$ to $M_n$) have an identical hardware design, for which the data protocol and the data transmission format on the serial databus are suitably selected, as is familiar to the person skilled in the art of the serial data transmission. All the data information passes in the form of measurement packets through all the measuring circuit modules ($M_1$ to $M_n$). Each measuring circuit module ($M_1$ to $M_n$) removes from each measurement packet information which it requires itself and adds its own measured values to the measurement packet. This makes it possible to manage the transmission of data with a serial databus (1) which is of very simple design.

If the measuring circuit modules ($M_1$ to $M_n$) are realized using CMOS technology, which is advantageous because of the low power consumption of the modules, it is necessary to ensure that a maximum operating voltage (for example, 15 V) is not exceeded. When the measuring circuit modules ($M_1$ to $M_n$) are fed locally by means of the battery block ($B_1$ to $B_n$), it is therefore necessary in each case to connect a voltage regulator upstream if the voltage produced by the blocks exceeds the maximum operating voltage of the modules. In this case, it may be more advantageous for the measuring circuit modules ($M_1$ to $M_n$) to draw their operating current from a carrier frequency via the capacitive coupling to the serial databus (1). The connection of the measuring circuit modules ($M_1$ to $M_n$) to the battery blocks ($B_1$ to $B_n$) then only serves exclusively for measuring the battery voltage.

In addition to pure measurement functions, functions which actively influence the charging or discharging processes of the respective battery blocks ($B_1$ to $B_n$) can also be integrated into the measurement circuit modules ($M_1$ to $M_n$). This can be achieved, for example, by means of individually controllable parallel resistors integrated into each of the respective measuring circuit modules ($M_1$ to $M_n$) which control an equalizing current that is conducted via measuring sensor leads (2) (or other leads which are not individually illustrated in the drawing and are connected to the respective poles of the battery blocks ($B_1$ to $B_n$)). Such an equalizing circuit is advantageous particularly if it is not possible to equalize the charge status of the battery blocks ($B_1$ to $B_n$) one with another by overcharging, as is the case with lithium batteries, owing to the associated risk of explosion. That is, since the individual battery blocks ($B_1$ to $B_n$) differ in their capacity, when the battery is recharged some battery blocks ($B_1$ to $B_n$) will already be fully charged and others not. However, if it is absolutely necessary to avoid the evaporation point, as in the case of lithium batteries, an equalizing circuit is indispensable in order to be able to charge all the battery blocks ($B_1$ to $B_n$) fully. Actuation of the equalizing function can also be effected via the serial databus (1).

Figure 2:
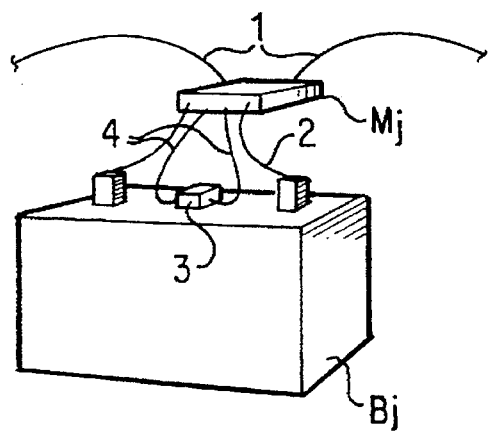
FIG. 2 is a schematic view of a specific battery block of the system in FIG. 1, with associated electronic monitoring component and integrated central data memory.

A central, non-volatile data memory (3) is integrated in one ($B_j$; $1 \leq j \leq n$) of the battery blocks, as is illustrated in FIG. 2. The data memory (3), which is realized, for example, as a RAM or EEPROM module, stores the data relevant to the battery ($B_j$) and thus physically linked to this block ($B_j$). The stored data contain inter alia, information relating to the number of charging cycles and discharging cycles, exhaustive battery discharges, extreme values etc.

The data storage which is permanently linked to the drive battery (B) in this way is also protected against unauthorized tampering by suitable measures, which is especially expedient for batteries in hire cars and service kits from battery manufacturers since, in this way, by calling up the stored data later, the supplier of the battery can obtain tamper-proof information relating to the operational history of the battery (B) during its service life. The central data storage module (3) is coupled via a connecting lead (4) to the measuring circuit module ($M_j$) associated with its battery block ($B_j$) and via said module to the serial databus (1). In this way, the data to be stored flow via the serial databus (1).

Figure 3:
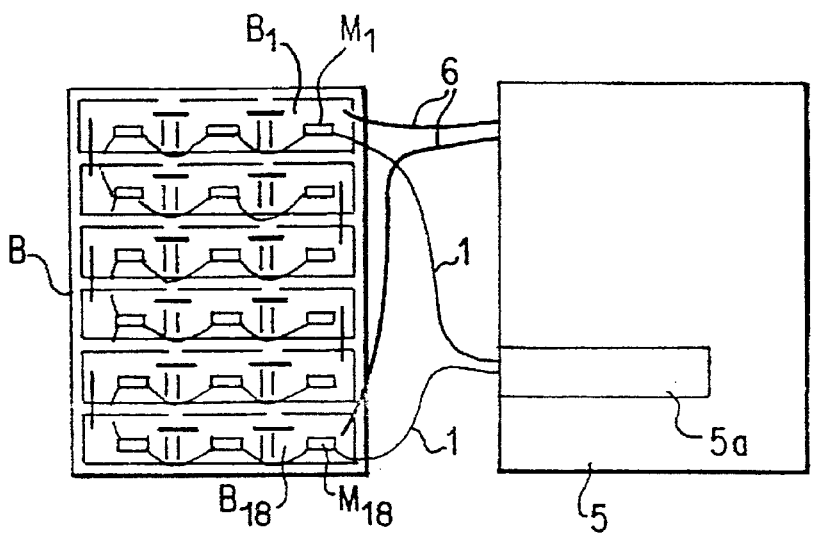
FIG. 3 is a schematic view of a battery system which is installed in an electric vehicle, according to FIGS. 1 and 2 with associated electronic drive unit.

FIG. 3 shows a traction battery (B) of this kind, with electronic monitoring in an electric vehicle, the battery (B) being coupled to an electronic drive unit (5) of the electric vehicle. The traction battery (B) comprises here, by way of example, 18 individual battery blocks ($B_1$ to $B_{18}$) which, as indicated by the thick current lead connections, are connected serially. A power cable (6) connects the electronic drive unit (5) to the positive pole of the first battery block ($B_1$) and to the negative pole of the last battery block ($B_{18}$) in order to conduct the discharging and charging currents. In addition, the electronic drive unit (5) is connected to the serial databus (1) via a suitable interface (5a).

In order to determine the battery status, apart from the voltage and temperature measurements in the individual battery blocks ($B_1$ to $B_{18}$), the accumulated battery current is also precisely detected by the electronic drive unit (5) to which the battery power cable (6) leads. At the same time, the electronic drive unit (5), which has a suitable microprocessor, evaluates the status data of the individual battery blocks ($B_1$ to $B_{18}$) transmitted via the serial databus (1). In this manner, the computation outlay for this data processing is completely shifted into the electronic drive unit (5) so that there is no need for data processing capacity in the traction battery (B), and the measuring circuit modules ($M_1$ to $M_{18}$) need only be configured to acquire and store data. The data obtained from the individual circuit modules ($M_1$ to $M_{18}$) for evaluation in the drive electronics (5), and the data to be stored in the central data memory (3) integrated in one of the battery blocks ($B_1$ to $B_{18}$) (not shown again separately in FIG. 3 for the sake of simplicity) flow via the serial databus (1).

Consequently, in the battery (B) there is only a minimum of costly electronic functions, and a minimum outlay on cabling. Those electronic functions beyond the acquisition and storage of data (for example, control of ventilation and/or heating which may be required for the traction battery (B)) are performed by the electronic drive unit (5).

Consequently, the invention realizes data acquisition and storage electronics which are integrated in the battery system and are changed and disposed of with the battery system, while the data processing electronics are accommodated in a unit which is external to the battery system. This configuration of an electronic battery monitoring device is simple and cost-effective to manufacture and requires only little outlay on cabling.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Electronic battery monitoring device for a battery, constructed from a plurality of blocks which are physically separated from one another, said monitoring device comprising:

a separate measuring circuit module, arranged on each respective battery block, for acquiring and communicating data concerning charging and discharging of said battery block;

a serial databus which connects the measuring circuit modules to one another; and a central digital data processing unit arranged outside the battery and connected to the serial databus, the central data processing unit and the measuring circuit modules being configured for communication via the databus; and a central data memory element physically linked to one of the battery blocks and connected to the serial databus.

2. Electronic battery monitoring device according to claim 1, wherein said battery is a traction battery for an electric vehicle.

3. Electronic battery monitoring device for a battery constructed from a plurality of blocks which are physically separated from one another, said monitoring device comprising:

separate measuring circuit modules, one such measuring circuit module being arranged on each respective battery block, for acquiring and communicating data concerning charging and discharging of said battery block;

a serial databus which connects the measuring circuit modules to one another; and a central data processing unit arranged outside the battery and connected to the serial databus, the central data processing unit and the measuring circuit modules being configured for communication via the databus; wherein all measurement data of all of said measuring circuit modules are transmitted via the serial databus in packets of measurement data, to which all the measuring circuit modules have access.

4. Electronic battery monitoring device according to claim 1, wherein the measuring circuit modules are capacitively coupled to one another.

5. Electronic battery monitoring device according to claim 1, wherein operating current required by the measuring circuit modules is fed to them by means of the serial databus.

6. Electronic battery monitoring device according to claim 1, wherein the measuring circuit modules draw operating current from respective associated battery blocks.

7. Electronic battery monitoring device according to claim 6, wherein each measuring circuit module has a controllable resistor, connected in parallel with the poles of a respectively assigned battery block, for controlling an equalizing current, whereby the respectively assigned battery block is protected against overcharging.

* * * * *